(12) United States Patent
McPhalen

(10) Patent No.: US 11,293,959 B2
(45) Date of Patent: *Apr. 5, 2022

(54) MEASUREMENT CIRCUIT

(71) Applicant: Schneider Electric USA, Inc., Andover, MA (US)

(72) Inventor: Erin C. McPhalen, Victoria (CA)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 801 days.

This patent is subject to a terminal disclaimer.

(21) Appl. No.: 16/127,703

(22) Filed: Sep. 11, 2018

(65) Prior Publication Data

US 2019/0257865 A1    Aug. 22, 2019

Related U.S. Application Data

(63) Continuation-in-part of application No. 16/026,836, filed on Jul. 3, 2018.

(60) Provisional application No. 62/631,993, filed on Feb. 19, 2018.

(51) Int. Cl.
*G01R 21/14* (2006.01)
*G01R 21/133* (2006.01)

(52) U.S. Cl.
CPC .......... *G01R 21/14* (2013.01); *G01R 21/133* (2013.01)

(58) Field of Classification Search
None
See application file for complete search history.

(56) References Cited

U.S. PATENT DOCUMENTS

| | | | |
|---|---|---|---|
| 6,615,147 B1* | 9/2003 | Jonker | G01R 21/133 702/182 |
| 2004/0169579 A1* | 9/2004 | Mattes | G01K 7/186 338/25 |
| 2006/0091877 A1* | 5/2006 | Robinson | G01R 21/133 324/76.11 |
| 2014/0100808 A1* | 4/2014 | Komati | G01D 3/0365 702/85 |
| 2016/0161435 A1* | 6/2016 | Fujimoto | G01K 7/203 374/142 |

* cited by examiner

*Primary Examiner* — Jay Patidar
*Assistant Examiner* — Haidong Zhang
(74) *Attorney, Agent, or Firm* — Locke Lord LLP

(57) ABSTRACT

A measurement circuit for monitoring at least one parameter of an input signal received from an external signal source includes at least one first measurement element coupled to the input signal and configured to provide an initial measurement signal indicative of a respective one or more of the at least one parameter of the input signal. At least one second measurement element is positioned proximate to the at least one first measurement element and configured to have a characteristic indicative of a stress condition associated with the at least one first measurement element. A compensation circuit is responsive to an output of the at least one second measurement element and to a reference signal to generate a compensation factor that is applied to the initial measurement signal to provide a corrected measurement signal.

20 Claims, 9 Drawing Sheets

MEASUREMENT CIRCUIT

CROSS REFERENCE TO RELATED APPLICATION

This application is a Continuation-in-Part (CIP) application of and claims the benefit of and priority to U.S. application Ser. No. 16/026,836, filed on Jul. 3, 2018, which application claims the benefit of and priority to U.S. Provisional Application No. 62/631,993, filed on Feb. 19, 2018 under 35 U.S.C. § 119(e), which applications are incorporated by reference herein in their entirety.

FIELD

This disclosure relates generally to measurement circuits, and more particularly, to a measurement circuit and methods for detecting and compensating for deviations in outputs of the measurement circuit due to a stress condition and/or aging of components in the measurement circuit.

BACKGROUND

As is known, measurement circuits are used in a variety of applications. One example application is in power system applications in which a measurement circuit is used in a metering device to measure one or more parameters (e.g., instantaneous and maximum average voltage) of the power system. Measurement circuits typically include one or more measurement elements for measuring the parameters. As is known, the measurement elements may drift from their initial or baseline values over time due to external factors such as aging and stress conditions (e.g., humidity, chemical interactions and temperature), resulting in inaccurate in measurements performed by the measurement elements.

SUMMARY

Described herein are concepts, systems, circuits and techniques related to a measurement circuit and methods for detecting and compensating for deviations in outputs of the measurement circuit due to a stress condition and/or aging of components (e.g., measurement elements) in the measurement circuit. More particularly, in one aspect, a measurement circuit according to the disclosure includes at least one first measurement element (e.g., a resistor) coupled to an input signal (e.g., a voltage signal) received from an external signal source (e.g., a utility power source) and configured to provide an initial measurement signal indicative of at least one parameter of the input signal. The measurement circuit also includes at least one second (or reference) measurement element positioned proximate to the at least one first measurement element and configured to have a characteristic indicative of a stress condition associated with (or aging of) the at least one first measurement element (and possibly other components of the measurement circuit). The measurement circuit further includes a compensation circuit responsive to an output of the at least one second measurement element and to a reference signal or value to generate a compensation factor indicative of a difference between the output of the at least one second measurement element and the reference signal or value. The compensation circuit is also configured to apply the compensation factor to the initial measurement signal to provide a corrected measurement signal. In embodiments, the corrected measurement signal is provided to a display device associated with the measurement circuit, control circuitry associated with the measurement circuit, and/or other circuitry associated with a power system which may include the measurement circuit.

The measurement circuit may include one or more of the following features either individually or in combination with other features. The at least one first measurement element may include a plurality of measurement elements. The at least one second measurement element may include a plurality of measurement elements. The at least one first measurement element may include a resistor. The at least one second measurement element may include a resistor. In embodiments, a resistance of the at least one second measurement element measured at a first time may be compared to a baseline resistance associated with the at least one second measurement element to detect the stress condition. The baseline resistance may be a resistance of the at least one second measurement element measured at a second time prior to the first time.

In embodiments, the measurement circuit may include a measurement device to measure a resistance of the at least one second measurement element. The at least one second measurement element may be substantially the same as the at least one first measurement element. The at least one second measurement element may include a plurality of coupled measurement elements. The at least one parameter monitored by the measurement circuit may include at least one of voltage, current, power, frequency, power factor, demand and energy. The stress condition may be (or include) at least one of a temperature condition (e.g., an over temperature condition) or an exposure to humidity and/or chemical interactions greater than a predetermined level. The at least one first measurement element may be supported by a same material (e.g., semiconductor material) substrate as the at least one second measurement element. The at least one first measurement element may be supported by a different material substrate than the at least one second measurement element. The measurement circuit may be (or include) a measurement circuit for use in a metering device. The metering device may be (or include) a metering device for use in a power system. As one example, the metering device may correspond to a metering device by Schneider Electric. The Schneider Electric metering device may be an internet-of-things (TOT) "connected" power quality meter, for example, with advanced capabilities including onboard power quality analysis and/or cybersecurity features.

In embodiments, by monitoring the characteristic (e.g., resistance) of the at least one second measurement element, which element is (a) exposed to substantially the same external factors as the at least one first measurement element and (b) experiences substantially the same drift characteristics as the at least one first measurement element, an output of the measurement circuit can be calibrated without interfering with operation of the at least one first measurement element and associated components.

In a further aspect, a method for monitoring at least one parameter of an input signal received from an external signal source includes providing at least one first measurement element coupled to the input signal and configured to provide an initial measurement signal indicative of a respective one or more of the at least one parameter of the input signal. The method also includes providing at least one second measurement element positioned proximate to the at least one first measurement element and configured to have a characteristic indicative of a stress condition associated with the at least one first measurement element. An output of the at least one second measurement element is compared to a reference signal or value using a compensation circuit to generate a compensation factor indicative of a difference between the output of the at least one second measurement element and the reference signal or value. The compensation factor is applied to the initial measurement signal to provide a corrected measurement signal.

The method may include one or more of the following features either individually or in combination with other features. The provided at least one second measurement element may include a resistor. The provided at least one second measurement element may be substantially the same as the provided at least one first measurement element. In embodiments, an ADC may be disposed between an output of the at least one second measurement element and an input of the compensation circuit. The ADC may be configured to generate a digital signal indicative of an analog output of the at least one second measurement element. The compensation circuit may be responsive to the digital signal received from the ADC to detect the stress condition associated with the at least one first measurement element.

The at least one parameter of the input signal may include at least one of voltage, current, power, frequency, power factor, demand and energy. The corrected measurement signal may be provided to control circuitry for configuring the at least one parameter. The output of the at least one second measurement element may be monitored over a predetermined time period (e.g., a user configured time period) to determine a stress condition type of the stress condition. For example, the output of the at least one second measurement element may be measured at a first time and one or more second times after the first time, and the measured output of the at least one second measurement element at the first time may be compared to the measured output of the at least one second measurement element at one or more of the second times to determine the stress condition type. In embodiments, the measured output of the at least one second measurement element at the first time may correspond to a baseline measured value (e.g., a baseline resistance) of the at least one second measurement element.

An indication of the stress condition type may be provided through a display device or an output signal of the measurement circuit. In embodiments, the stress condition type may be at least one of a temperature condition (e.g., an overtemperature condition) or an exposure to humidity and/or chemical interactions greater than a predetermined level.

The above and below described arrangements have been demonstrated to improve accuracy and temperature sensitivity of measurement circuits (e.g., metering measurement circuits) in a cost-effective manner. As is known, component drift due to temperature, aging, and other environmental factors can directly impact the short and long-term accuracy of products (e.g., measurement circuits). Some regulatory standards require measurement circuits to maintain a specified accuracy after long term environmental influences. Changes in initial or baseline values of components typically cannot be corrected after initial calibration and can affect accuracy of the products. While components optimized for providing stable or tracking values are available, these components typically have significant costs associated with them.

One aspect of the disclosure proposes using a reference (or second) measurement element and a compensation circuit to adjust a reference voltage input of an ADC such that the gain of the ADC tracks towards the initial or calibrated value of active (or first) measurement elements in a measurement circuit. Drift effects associated with a change in measurement values of the first measurement elements will be mirrored by the second measurement elements since the second measurement elements are exposed to the same or similar environmental influences and aging effects as the first measurement elements. This allows for the same overall accuracy performance of using more expensive components in lower cost overall solution. By influencing the value of the ADC reference voltage input with respect to a change in component value of concern, the transfer function of the ADC can be influenced remove this component value change.

In embodiments, the systems and methods may be found useful in metering systems/devices (e.g., "high-end" metering systems/devices). One key feature of the metering systems/devices is increased revenue metering accuracy, which would typically require expensive components (such as stable precision resistors) in the analog front end of the meter.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
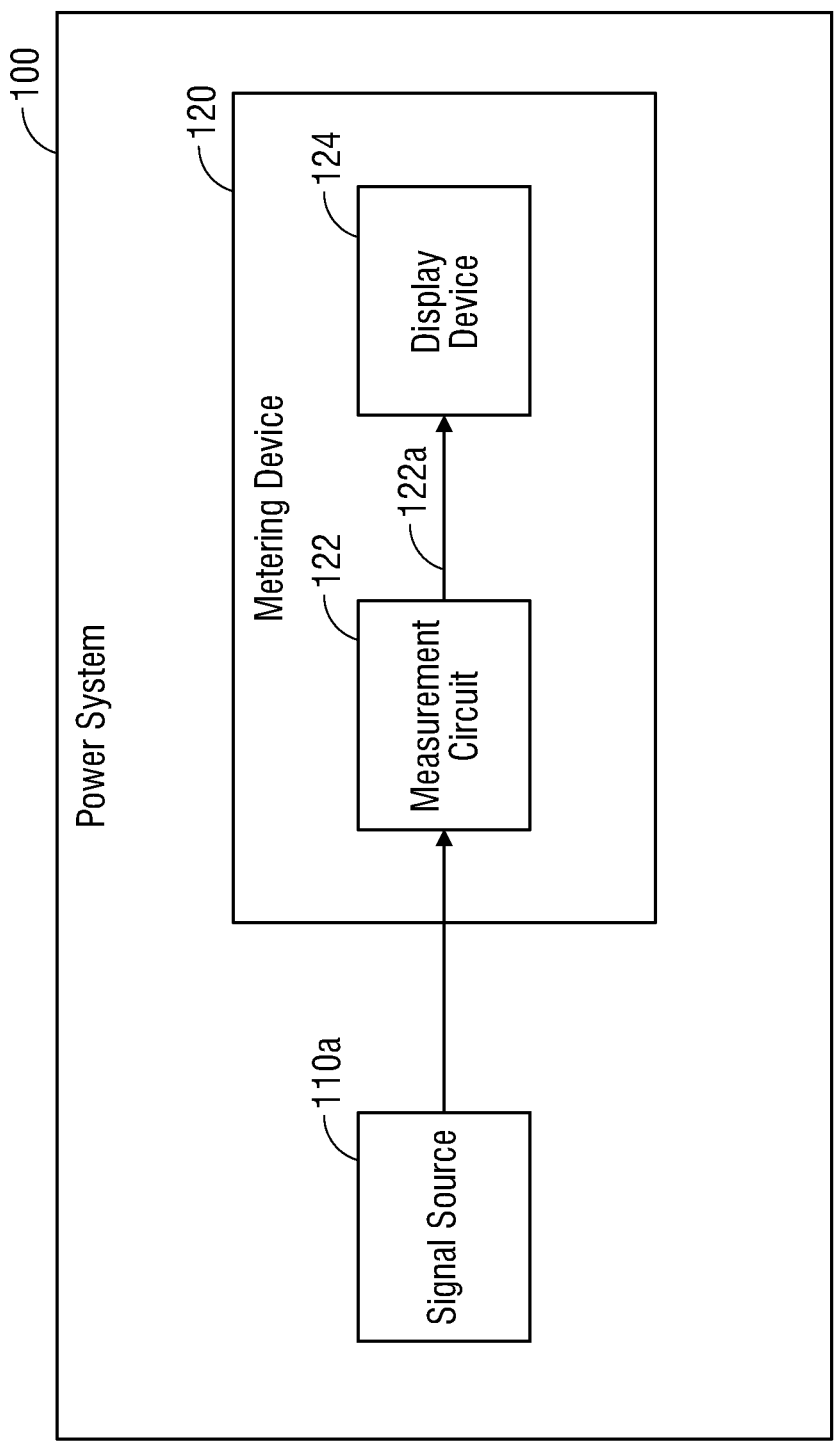
FIG. 1 is a block diagram of an example power system including a signal source and a metering device capable of monitoring one or more parameters of the signal source.

Referring to FIG. 1, an example power system 100 includes a signal source 110 and a metering device 120 capable of monitoring one or more parameters of the signal source 110. The signal source 110 and the metering device 120 may each take a variety of forms. For example, the signal source 110 may take the form of a renewable energy source (e.g., hydropower, geothermal, wind, and solar) or a non-renewable energy source (e.g., fossil fuel power plant). Additionally, the metering device 120 may take the form of a device for monitoring the amount of electric energy consumed by a residence or business, or a particular electrically powered device of the residence or business. The metering device 120 may be coupled to the signal source 110 by one or more connectors and/or mediums (e.g., transmission lines).

In the example embodiment shown, the metering device 120 includes a measurement circuit 122 and a display device 124. The measurement circuit 122 is coupled to receive a signal 110a generated by the signal source 110 at an input and configured to generate a signal 122a indicative of one or more monitored parameters of the signal 110a at an output thereof. In some embodiments, the parameters include at least one of voltage, current, power, frequency, power factor, demand and energy. Based on the parameter type, the signal 122a may be indicative of one or more values (e.g., instantaneous, average maximum, etc.) of the signal 110a. For example, in embodiments in which the signal 110a (i.e., an input signal 110a) is a voltage signal, the signal 122a (i.e., an output signal 122a) may be indicative of an instantaneous and/or a maximum average voltage of the signal 110a.

In some embodiments, the output signal 122a may be provided to a display device for displaying the monitored parameters (or select ones of the monitored parameters). The display device may be the display device 124 of the metering device 120, as shown. Additionally, or alternatively, the display device may be a display device of a remote computing device, for example.

In some embodiments, the output signal 122a may also be provided to control circuitry (not shown) for configuring (or controlling or adjusting) one or more of the monitored parameters. The control circuitry may be control circuitry of the metering device 120 and/or control circuitry coupled to the metering device 120.

The measurement circuit 122 includes a plurality of electrical components (e.g., resistors, capacitors, inductor, transistors, etc.). As is known, electrical components typically have associated operational ratings and limits, or ranges of operation, such as those pertaining to temperature and exposure to humidity and/or chemical interactions. Exposure to certain conditions beyond a component's specified rating (i.e., stress conditions) during shipping, storage, and/or use may, for example, adversely affect operation of the measurement circuit components and, thus, the reliability and accuracy of the measurement circuit and the metering device. For example, deviations in accuracy of parameter measurements performed by measurement elements of the measurement circuit due to stress conditions and/or aging of the components may impact the accuracy of the measurement circuit output and, thus, the accuracy of the metering device output. The foregoing may result in inaccurate parameter reporting by the metering device, which may lead to energy waste, for example. Accordingly, it is important for the metering device to have a means for compensating for deviations in measurement accuracy due to stress conditions and/or aging of the measurement circuit components.

Example measurement circuits and example means for compensating for deviations in measurement accuracy due to stress conditions and/or aging of the measurement circuit components are discussed in connection with figures below.

Figure 1A:
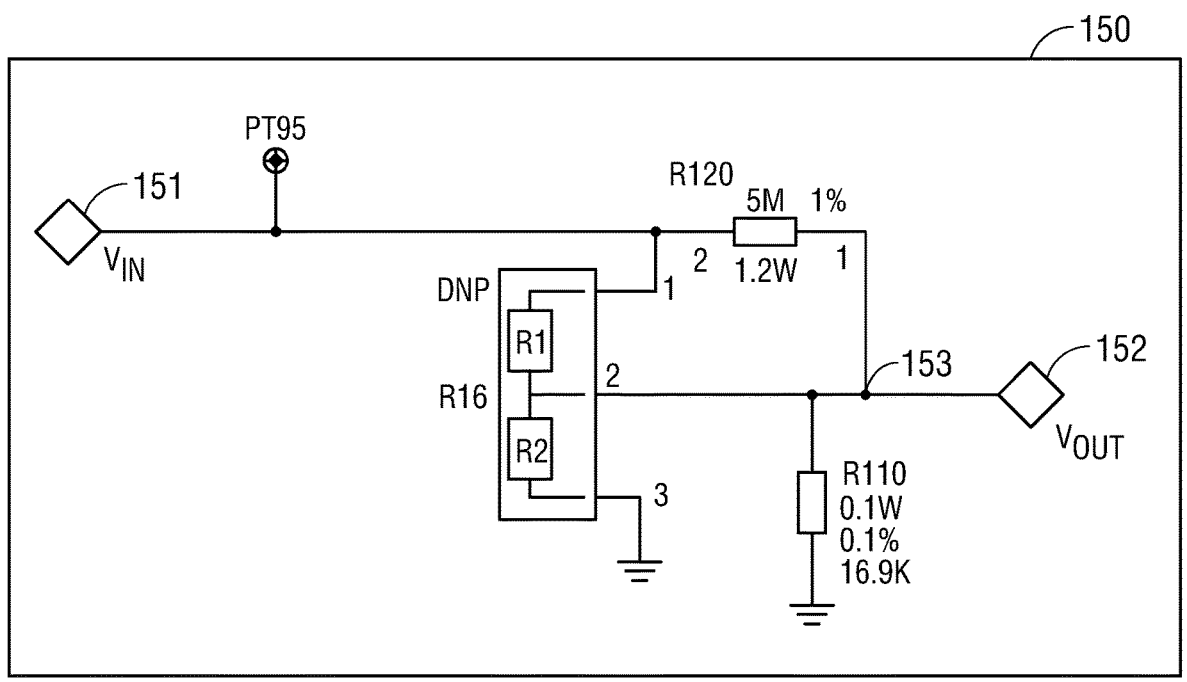
FIG. 1A is a schematic diagram of an example prior art measurement circuit.

Referring now to FIG. 1A, an example prior art measurement circuit 150 includes a resistor R110 and a resistor R120. The measurement circuit 150 has an input 151 at which an input signal (here, an input voltage ($V_{IN}$)) is received and an output 152 at which an output signal (here, an output voltage ($V_{OUT}$)) is provided. The output voltage may be coupled to circuitry (not shown) for monitoring a voltage level of the input voltage.

As illustrated, resistor R120 of measurement circuit 150 has a first terminal coupled to the measurement circuit input 1101 and a second terminal coupled to a node 153 formed between a first terminal of resistor R110 and the measurement circuit output 152. Additionally, resistor R110 has a second terminal coupled to a reference potential (here, ground).

Resistors R110 and R120 form a divider circuit that is responsive to the input voltage to generate a divided reference voltage at the node 153. The divided reference voltage, which corresponds to the output voltage of measurement circuit 150, has a voltage value that is a fraction of a voltage value of the input voltage and may be represented by $V_{OUT}=V_{IN}\times(R110/(R110+R120))$. It follows that the output voltage (or gain of measurement circuit 150) is directly proportional to the input voltage and the ratio of R110 and R120.

In instances where the input voltage is expected to be relatively "large", resistor R120 is typically chosen to have a relatively "large" resistance value (e.g., a resistance of one or more megaohms) (here, five megaohms) due, at least in part, to safety concerns. As is known, the resistance value of a resistor tends to drift in response to at least time and temperature. As is also known, metal foils and other precision resistor technologies, for example, which have a substantially stable, well-defined resistance, generally have resistance values limited up to about one-hundred kiloohms. It follows that in instances where resistor R120 has a relatively large resistance value (i.e., a resistance greater than about one-hundred kiloohms), resistor R120 tends to exhibit a substantially "large" drift over temperature and time. Resistor R110 on the other hand can be selected from much more stable resistor technology families (that do not exhibit a substantially large drift) due to R110's significantly lower resistance value (here, sixteen point nine kiloohms) than R120.

The gain (G) observed by measurement circuit 150 is given by $G=(R110/(R110+R120))$. However, since resistor R120 may have a resistance which is significantly greater than resistor R110 (i.e., R120>>R110), the measurement circuit gain G can be simplified to G=R110/R120. If we assume resistor R110 is selected from a stable resistor technology family, then the dominant factor in measurement uncertainty is the drift associated with resistor R120. A ten percent increase in the resistance value of resistor R120 due to drift, for example, may result in a measurement error of minus ten percent. Conversely, a ten percent decrease in the resistance value of resistor R120 due to drift may result in a measurement error of plus ten percent. As is known, measurement errors are undesirable. For example, a measurement error in the resistance of resistor R120 may result in the output of measurement circuit 150 (here, $V_{OUT}$) being inaccurate, and in turn result in inaccurate monitoring of the voltage level of the input voltage.

As illustrated, measurement circuit 150 also includes a space for a resistor R16 that is not populated in the illustrated example (i.e., R16 corresponds to a do not populate (DNP) resistor). The resistor R16 has a first terminal coupled to the measurement circuit input 1101, a second terminal coupled to a reference potential (here, ground), and a third, intermediate terminal coupled to the measurement circuit output 152. In some examples, resistor R16 may be populated in the circuit and used instead of resistors R110, R120 to provide the output voltage, with the output voltage being generated at the third terminal of resistor R16. Similar to the divider circuit formed from resistors R110, R120, resistor R16 may experience a drift in resistance due to at least time and temperature, and in turn cause the output voltage to have a measurement error.

Measurement circuits according to embodiments of the disclosure seek to substantially reduce (and, ideally eliminate) measurement errors through relatively inexpensive means.

Figure 2:
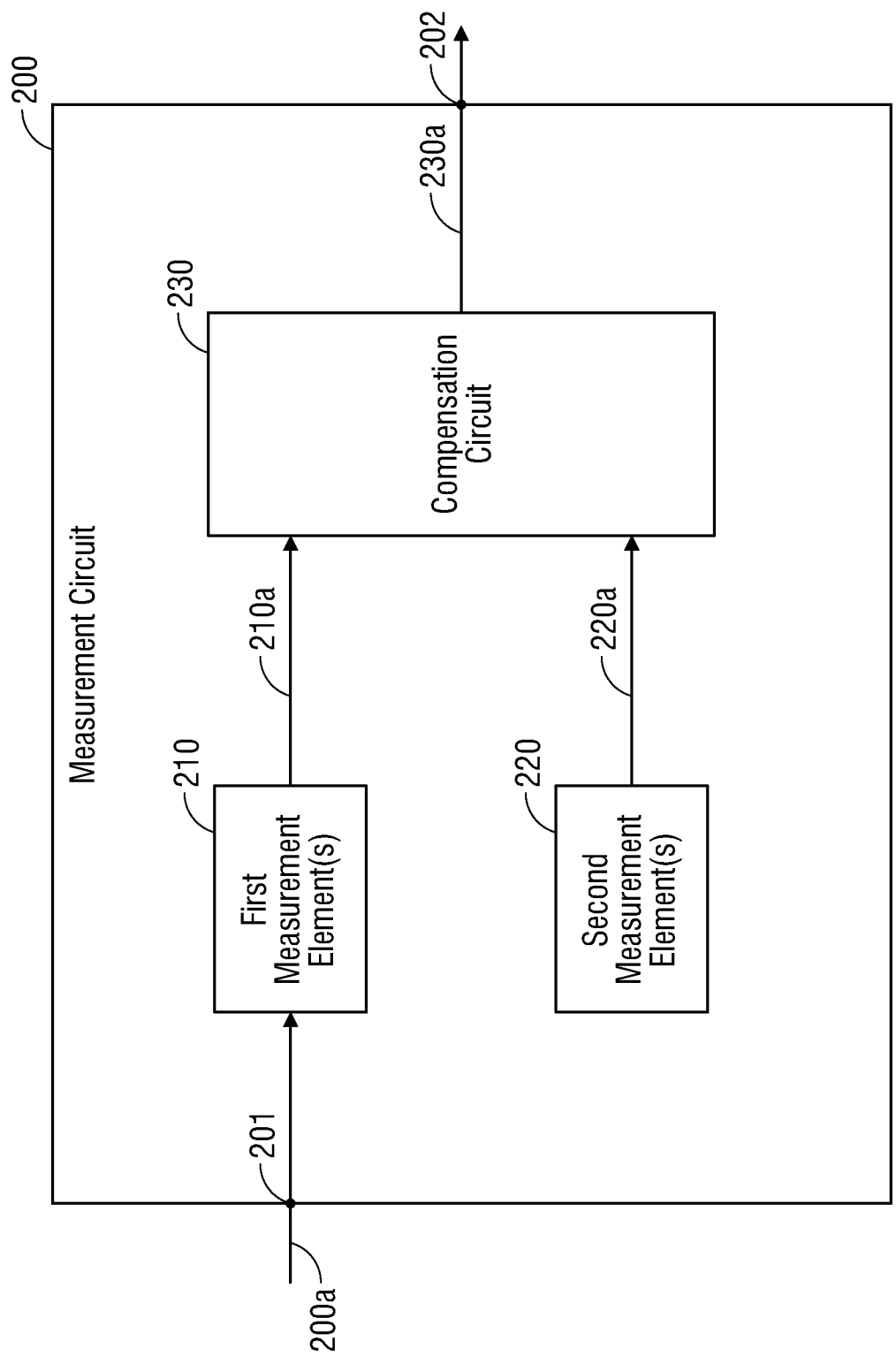
FIG. 2 is a block diagram of an example measurement circuit in accordance with embodiments of the disclosure, the measurement circuit capable of being used in a metering device, for example.

Referring to FIG. 2, an example measurement circuit 200 according to a first embodiment of the disclosure is shown. The measurement circuit 200 has at least one input (here, an input 201) and at least one output (here, an output 202). Additionally, the measurement circuit 200 includes at least one first measurement element 210, at least one second (or reference) measurement element 220 and a compensation circuit 230. In the illustrated embodiment, the at least one first measurement element 210 has a first terminal coupled to measurement circuit input 201 and a second terminal coupled to a first terminal of the compensation circuit 230. Additionally, in the illustrated embodiment, the at least one second measurement element 220 has a terminal coupled to a second terminal of the compensation circuit 230, and the compensation circuit 230 has a third terminal coupled to measurement circuit output 202. In some embodiments, the measurement circuit input 201 is coupled to an input of a metering device (e.g., 120, shown in FIG. 1) in which the measurement circuit 200 may be used. Additionally, in some embodiments, the measurement circuit output 202 is coupled to an output of the metering device and/or other components (e.g., display device 124, shown in FIG. 1) of the metering device. As discussed above in connection with FIG. 1, the metering device may be coupled to a signal source (e.g., 110, shown in FIG. 1).

The at least one first measurement element 210 is an element used to measure one or more parameters (e.g., voltage, current, etc.) of an input signal (here, input signal 200a). In embodiments, the at least one first measurement element 210 may take the form a resistor (e.g., a current sense resistor), a capacitor, or substantially any other type of element (or elements) which may be found suitable for measuring the parameters. It is understood that the quantity of the at least one first measurement element 210 (e.g., one element, two elements, three elements, etc.) and arrangement(s) of the at least one first measurement element 210 may be selected based, at least in part, on the parameter(s) to be measured by the at least one first measurement element 210. For example, in embodiments in which the at least one first measurement element 210 is configured to measure a voltage level of the input signal 200a, the at least one first measurement element 210 may include a plurality of measurement elements. The plurality of measurement elements may be coupled in a divider configuration, for example. It is understood that measurement elements of the at least one first measurement element 210 may be arranged in series or in parallel based on the parameter(s) to be measured.

The at least one second measurement element 220 is a reference (or "witness") element used to detect deviations in an output of the at least one first measurement element 210 due to aging and/or stress conditions. More particularly, the at least one second measurement element 220 has a characteristic indicative of a stress condition associated with (and/or aging of) the at least one first measurement element 210. The characteristic may correspond to a resistance in embodiments in which the at least one second measurement element 220 is a resistor, for example. The characteristic may also correspond to other types of parameters, for example, depending on the element type of the at least one second measurement element 220. The at least one second measurement element 220 is positioned proximate to the at least one first measurement element 210 and, thus, may experience the same (or substantially) similar output deviations as the at least one first measurement element 210.

In some embodiments, the at least one second measurement element 220 is substantially the same as (i.e., is a same element type) as the at least one first measurement element 210. For example, in embodiments in which the at least one first measurement element 210 is (or comprises) a resistor, the at least one second measurement element 220 may be (or comprise) a same or similar type resistor as the at least one first measurement element 210. Additionally, in embodiments in which the at least one first measurement element 210 is (or comprises) a capacitor, the at least one second measurement element 220 may be (or comprise) a same or similar type capacitor as the at least one first measurement element 210. In embodiments, the at least one second measurement element 220 is positioned proximate to the at least one first measurement element 210. For example, in embodiments the at least one second measurement element 220 is within a same printed circuit board assembly (PCBA) structure, a same enclosure or a same installed environment as the at least one first measurement element 210. Additionally, in embodiments the at least one second measurement element 220 is within a predetermined spacing or distance from the at least one first measurement element 210. Similar to the at least one first measurement element 210, the at least one second measurement element 220 may include a plurality of measurement elements in some embodiments. The plurality of measurement elements may be arranged in series or in parallel.

During operation of measurement circuit 200, the circuit 200 is configured to receive an input signal 200a at input 201 and to provide an output signal 230a indicative of a level or value of one or more parameters (e.g., voltage, current, etc.) of the input signal 200a at output 202. More particularly, the at least one first measurement element 210 is coupled to the input signal 200a and configured to provide an initial measurement signal 210a indicative of a respective one or more of the parameters. In some embodiments, the initial measurement signal 210a (e.g., an analog signal) is related to a value (e.g., a measured resistance value, or charge) of the at least one first measurement element 210. Additionally, in some embodiments the initial measurement signal 210a is related to an output of the at least one first measurement element 210, or to an output of a node proximate to the at least one first measurement element 210.

The compensation circuit 230, which may be provided as or include a computer processor in some embodiments, is responsive to an output of the at least one second measurement element 220 (here, an output signal 220a) and to a reference signal or value to generate a compensation factor indicative of a difference between the output of the at least one second measurement element 230 and the reference signal or value. In some embodiments, the reference signal or value is stored in a memory device of the compensation circuit 230 (or measurement circuit 200) and retrieved upon request. In other embodiments, the reference signal or value may be received from one or more sources external to the measurement circuit 200. For example, in one embodiment the reference signal or value may be received from a reference signal generator circuit of a power system in which the measurement circuit is used (e.g., 100, shown in FIG. 1).

In embodiments in which the at least one second measurement element 220 is a resistor, for example, a resistance of the at least one second measurement element 220 measured at a first time may be compared to a baseline resistance (i.e., a reference signal or value) associated with the at least one second measurement element 220 to generate the compensation factor (and detect a stress condition associated with the at least one first measurement element 210). In some embodiments, the baseline resistance is a resistance of the at least one second measurement element 220 measured at a second time prior to the first time. At the first time (e.g., a predetermined time after shipment or use of the at least one second measurement element 220) under different operating conditions, the measured resistance may drift from the baseline resistance (i.e., an original value), resulting in an offset between the measured value and the baseline resistance. The drift may be used to detect a stress condition. The stress condition may be at least one of an over temperature condition or an exposure to humidity and/or chemical interactions greater than a predetermined level. In embodiments, the resistance of the at least one second measurement element 220 is measured by a measurement device coupled to the at least one second measurement element 220.

Returning now to operation of compensation circuit 230, circuit 230 is also configured to apply the compensation factor to the initial measurement signal 210a received from the at least one first measurement element 210 (or circuitry coupled to the at least one measurement element 210) to provide a corrected measurement signal 230a. For example, the compensation circuit 230 may dynamically adjust (i.e., in real or substantially real time) a level or value of the initial measurement signal 210a based on the compensation factor in providing the corrected measurement signal 230a. The corrected measurement signal 230a is provided at the third terminal of the compensation circuit 230 and, in turn, received by the measurement circuit output 202.

In the illustrated embodiment, the corrected measurement signal 230a corresponds to an output signal of the measurement circuit 200. However, it is understood that in some embodiments the corrected measurement signal 230a may be received by additionally circuitry (not shown) of the measurement circuit 200, and the output signal of the measurement circuit 200 may be associated with output signals generated or otherwise provided by the additional circuitry. Additionally, it is understood that in some embodiments the corrected measurement signal 230a (or a signal associated with the corrected measurement signal) may correspond to but one of many output signals of the measurement circuit 200. One output signal is shown in FIG. 2 for reasons of simplicity and clarity and is not intended to be limiting.

In some embodiments, an indication of detected deviations (or stress conditions) may be provided to circuits or systems internal to or external to the measurement circuit 200. For example, the detected deviations may be indicated in the form of a light emitting diode or other visual indicator of the measurement circuit 200 or as a signal provided at a dedicated output pin of the measurement circuit 200. Additionally, an indication of the detected deviations may be provided to a display device of a metering device (e.g., 120, shown in FIG. 1) in which the measurement circuit 200 is used. A user viewing the display device can, for example, respond to the detected deviations by replacing one or more of the components (e.g., first measurement elements 210) associated with the detected deviations.

The detected deviations may also be stored in a memory device (e.g., a memory device of or associated with the compensation circuit 230) for later analysis in some embodiments. For example, the detected deviations may be analyzed for determining or validating component lifetime, or for determining a particular type of stress condition (e.g., over temperature condition) to which the at least one first measurement element 210 and the at least one second measurement element 220 are exposed. The particular type of stress condition may be determined (on the measurement circuit 200 or externally), for example, by comparing monitored values of the detected deviations (e.g., a first deviation value, a second deviation value, etc.) over a predetermined time period, and associating the compared values with the stress condition type. The stress condition type may, for example, be determined or identified from a plurality of stress condition types (e.g., temperature condition, exposure to humidity and/or chemical interactions greater than a predetermined level, and other stress conditions known to those of ordinary skill in the art). In embodiments, the plurality of stress condition types may be user configured stress conditions that are input by a user (e.g., via a user device), and stored on the above-described memory device (e.g., in a look-up-table of the memory device). The determined stress condition type may be reported through a display device or output signal (of the measurement circuit 200 or externally), for example. In embodiments, the output signal may be received by a control circuitry associated with the measurement circuit 200, for example, for controlling one or more parameters associated with the signal source from which the input signal 200a is received.

In some embodiments, the at least one second measurement element 220 is supported by a same material substrate as the at least one first measurement element 210. In other embodiments, the at least one first measurement element 210 is supported by a first material substrate and the at least one second measurement element 220 is supported by a second, different material substrate. When a different material substrate, the second substrate supporting the at least one second measurement element 220 may be configured to be electrically coupled to and decoupled from the first material substrate supporting the at least one first measurement element 210 and, thus, may occupy substantially no space on the first material substrate (e.g., other than connections as may be required for coupling and decoupling for analyzing the at least one second measurement element 220 for stress conditions).

Figure 3:
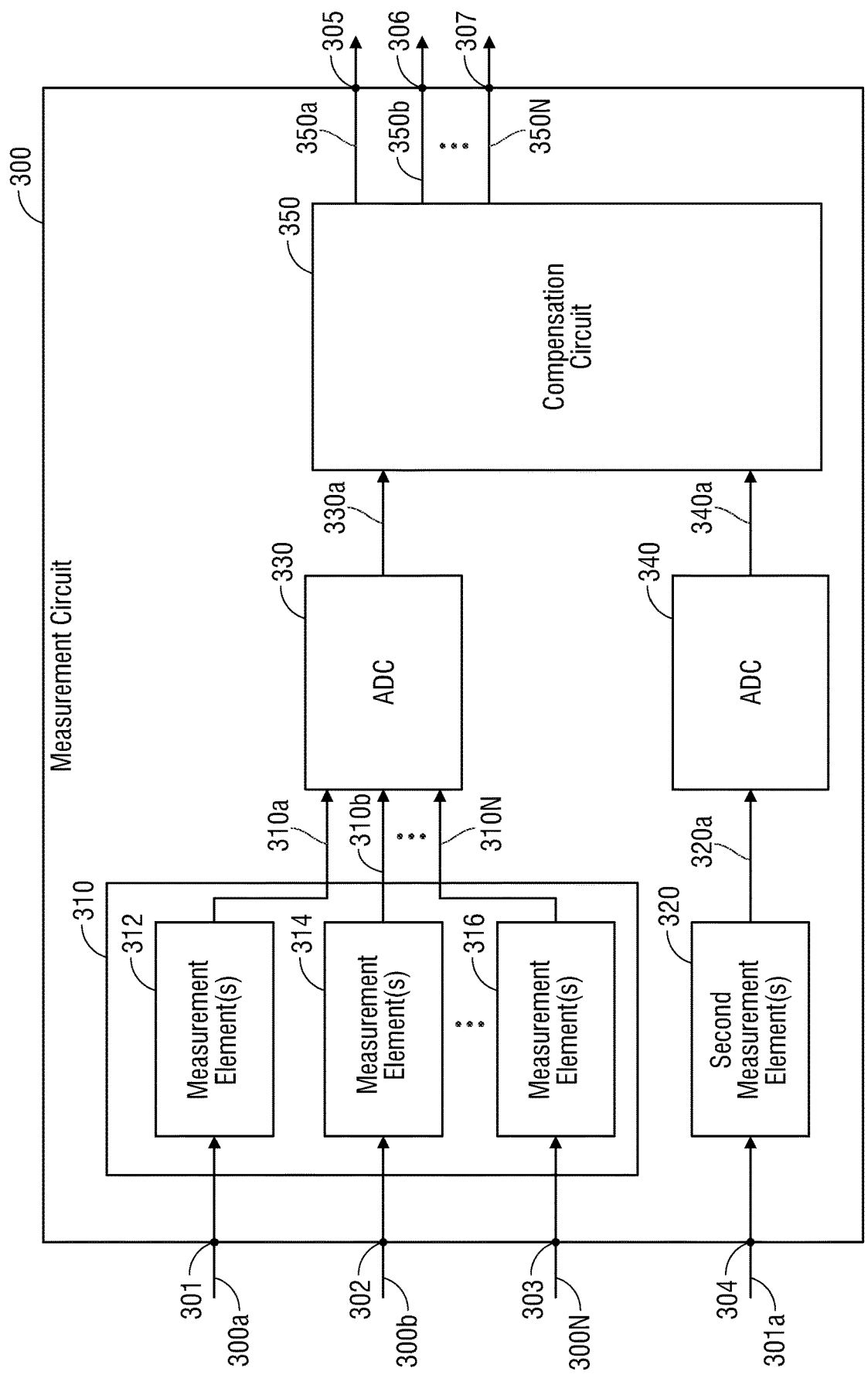
FIG. 3 is a block diagram of another example measurement circuit in accordance with embodiments of the disclosure.

Referring to FIG. 3, another example measurement circuit 300 according to embodiments of the disclosure includes at least one first measurement element 310, at least one second (or reference) measurement element 320, a first analog to digital converter (ADC) 330, a second ADC 340 and a compensation circuit 350.

The at least one first measurement element 310, which may be the same as or similar to first element 210 described above in connection with FIG. 2, includes a plurality of measurement elements (here, measurement elements 312, 314, 316) in the illustrated embodiment. Each of the measurement elements 312, 314, 316 has a terminal (e.g., a first terminal) coupled to a respective input of the measurement circuit 300 (here, inputs 301, 302, 303) in the example embodiment shown. In some embodiments, at least one of the measurement elements 312, 314, 316 includes a plurality of measurement elements.

The first ADC 330 has at least one input (here, a like plurality of inputs as the plurality of first measurement elements 312, 314, 316) and at least one output (here, a single output). The ADC inputs are coupled to respective terminals (e.g., second terminals) of the first measurement elements 312, 314, 316 and the ADC output is coupled to at least one input (here, a single input) of the compensation circuit 350.

The at least one second measurement element 320, which may be the same as or similar to second element 220 described above in connection with FIG. 2, has a terminal (e.g., a first terminal) coupled to a respective input of the measurement circuit 300 (here, inputs 304) in the example embodiment shown. The at least one second measurement element 320 has a characteristic indicative of a stress condition associated with (or aging of) the at least one first measurement element 310 (here, first measurement elements 312, 314, 316).

The second ADC 340 has at least one input (here, single input) and at least one output (here, a single output). The ADC input is coupled to a respective terminal of the at least one second measurement element 320 and the ADC output is coupled to at least one input (here, a single input) of the compensation circuit 350. In some embodiments, the first ADC 330 has multiple converters/channels. In such embodiments, the second ADC 340 may be optional and the first ADC 330 may have a respective input (e.g., associated with a particular converter/channel) coupled to the respective terminal of the at least one second measurement element 320. Additionally, the first ADC 330 may have a respective output (e.g., associated with the particular converter/channel) coupled to the at least one input of the compensation circuit 350. It is understood that many ADC configurations (and other means for converting analog signals to digital signals) are possible. For simplicity, the text described below will assume that measurement circuit 300 includes both the first and second ADCs 330, 340.

The compensation circuit 350 of measurement circuit 300, which may be the same as or similar to compensation circuit 230 described above in connection with FIG. 3 (and may be provided as or include a computer processor in some embodiments), has at least one output (here, a like plurality of outputs as the plurality of first measurement elements 312, 314, 316).

During operation of measurement circuit 300, the first measurement elements 312, 314, 316 are coupled to input signals 300a, 300b, 300N (e.g., voltage and/or current signals) received at respective inputs 301, 302, 303 of the measurement circuit 300 and configured to provide respective initial measurement signals 310a, 310b, 310N indicative of a one or more of parameters (e.g., voltage, current, etc.) of the input signals 300a, 300b, 300N. The first ADC 330 is responsive to the initial measurement signals 310a, 310b, 310N to provide corresponding converted digital signals (here, shown as single digital signal 330a for simplicity).

The second measurement element 320 is coupled to an input signal 301a received at input 304 of the measurement circuit 300 and configured to provide an output signal 320a in response thereto. In some embodiments, the input signal 301a is a known reference signal (e.g., a voltage signal). The second ADC 340 is responsive to the output signal 320a to provide a corresponding converted digital signal 340a.

The compensation circuit 350 is responsive to the digital signal 340a and to a reference signal or value to generate a compensation factor indicative of a difference between the digital signal 340a (i.e., an output of the at least one second measurement element 320) and the reference signal or value. The compensation circuit 350 is also configured to apply the compensation factor to each of the digital signals received from the ADC 330 to provide corrected measurement signals 350a, 350b, 350N. The corrected measurement signals 350a, 350b, 350N are each provided to respective measurement circuit outputs 305, 306, 307.

Similar to measurement circuit 200 described above in connection with FIG. 2, measurement circuit 300 is capable of dynamically correcting (i.e., in real or substantially real time) outputs of the first measurements elements 312, 314, 316 without impeding normal operation of the measurement circuit 300.

Figure 4:
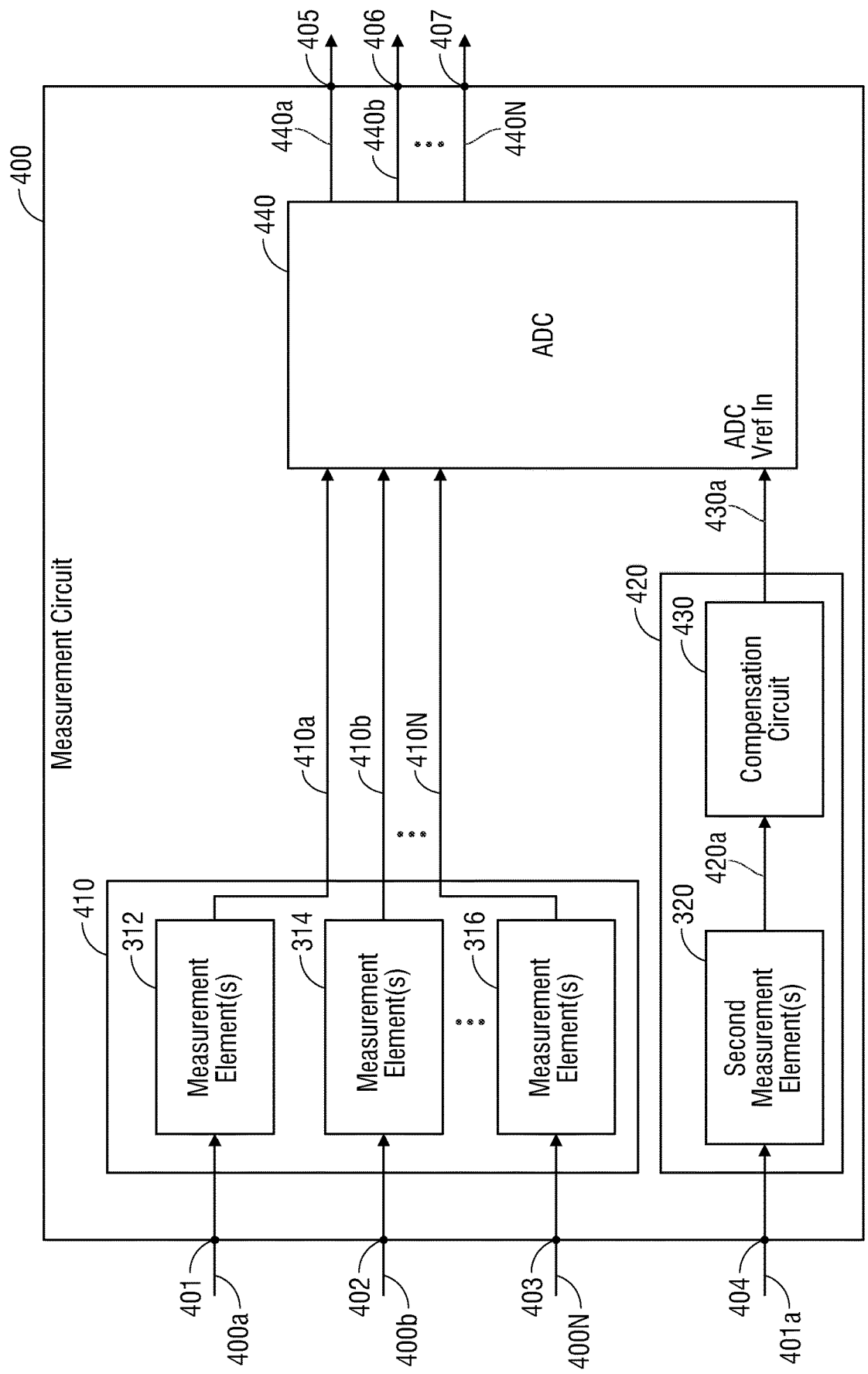
FIG. 4 is a block diagram of a further example measurement circuit in accordance with embodiments of the disclosure.

Referring to FIG. 4, in which like elements of FIG. 3 are provided having like reference designations, an example measurement circuit 400 according to embodiments of the disclosure includes at least one first measurement 410, a so-called "witness circuit" 420, and an ADC 440. The at least one first measurement element 410 includes a plurality of measurement elements (here, measurement elements 312, 314, 316), each of which is coupled to a respective input of the measurement circuit 400 (here, inputs 401, 402, 403). In some embodiments, at least one of the measurement elements 312, 314, 316 includes a plurality of measurement elements.

The witness circuit 420 includes at least one second measurement element 320 and a compensation circuit 430. The at least one second measurement element 320 has a terminal (e.g., a first terminal) coupled an input (here, input 404) of the measurement circuit 400. Additionally, the at least one second measurement element 320 has a terminal (e.g., a second terminal) coupled to a terminal (e.g., a second terminal) of the compensation circuit 430. The compensation circuit 430 also has terminal (e.g., a second terminal) coupled to a voltage reference input (here, labeled ADC Vref In) of the ADC 440. In some embodiments, the compensation circuit 430 may be provided as or include a computer processor.

The ADC 440 has at least one input (here, a like plurality of inputs as the plurality of first measurement elements 312, 314, 316, and an additional reference voltage input) and at least one output (here, a like plurality of outputs as the plurality of first measurement elements 312, 314, 316). The ADC inputs are coupled to respective terminals (e.g., second terminals) of the first measurement elements 312, 314, 316, and the reference voltage input is coupled to the compensation circuit 430, as noted above.

During operation of measurement circuit 400, the first measurement elements 312, 314, 316 are coupled to input signals 400a, 400b, 400N (e.g., voltage and/or current signals) received at respective inputs 401, 402, 403 of the measurement circuit 300, and the first measurement elements 312, 314, 316 are configured to provide respective initial measurement signals 410a, 410b, 410N indicative of a one or more of parameters (e.g., voltage, current, etc.) of the input signals 400a, 400b, 400N. For example, in embodiments in which the first measurement elements 312, 314, 316 are (or comprise) capacitors, the first measurement elements 312, 314, 316 may capture transients in one or more of the input signals 400a, 400b, 400N. Additionally, the first measurement elements 312, 314, 316 (alone or in combination with circuitry coupled to the first measurement elements 312, 314, 316) may provide initial measurement signals 410a, 410b, 410N indicative of the captured transients.

The second measurement element 320 of the witness circuit 420 is coupled to an input signal 401a received at input 404 of the measurement circuit 400 and configured to provide an output signal 420a in response thereto. In some embodiments, the input signal 401a is a known reference signal (e.g., a voltage signal).

The compensation circuit 430 is responsive to the output signal 420a and to a reference signal or value to generate a compensation signal 430a indicative of a difference between the output signal 420a (i.e., an output of the at least one second measurement element 320) and the reference signal or value.

The ADC 440 is responsive to the initial measurement signals 410a, 410b, 410N and to a reference voltage to provide corrected measurement signals 440a, 440b, 440N. More particularly, the ADC 440 has an associated gain and a gain level of the ADC 440 (and signals produced therefrom) is related to a voltage level of a reference voltage received at the reference voltage input. The voltage level of the reference voltage is adjusted in response to the compensation signal 430a. In some embodiments, the compensation signal 430a corresponds to the reference voltage. In other embodiments, the compensation signal 430a is provided to a reference voltage generator, with the reference voltage generator providing the reference voltage. The reference voltage generator may be provided in the witness circuit in some embodiments, or the witness circuit may be coupled to the reference voltage generator for providing the reference voltage.

In the example embodiment shown, the corrected measurement signals 440a, 440b, 440N generated by the ADC 440 are provided to respective measurement circuit outputs 405, 406, 407.

According to certain aspects of the disclosure, the above-described embodiment is a function of gain tracking so that the end to end system gain is ideally net zero (or substantially net zero) from nominal. More particular, in embodiments a voltage level of the reference voltage input to the ADC 440 is adjusted so that the end to end system gain is ideally net zero (or substantially net zero) from nominal. In embodiments, an amount by which the voltage level is adjusted is selected to provide for the above-described end to end system gain.

For one example ADC, +/−5V CODE=VIN/5V×32,768×Vref/2.5V. The ADC value (CODE) is described with Vref (a reference voltage) equal to 2.5V. If we make Vref a variable and the rest constants, CODE=const*VIN/Vref. A change in Vref will provide an inverse change in the ADC reading. It follows that if VIN is held constant and Vref is increased by about ten percent, a value read by the ADC may decrease by about ten percent.

The above and below described circuits are implemented to take advantage of this relationship with the reference voltage inputs of ADCs.

Figure 4A:
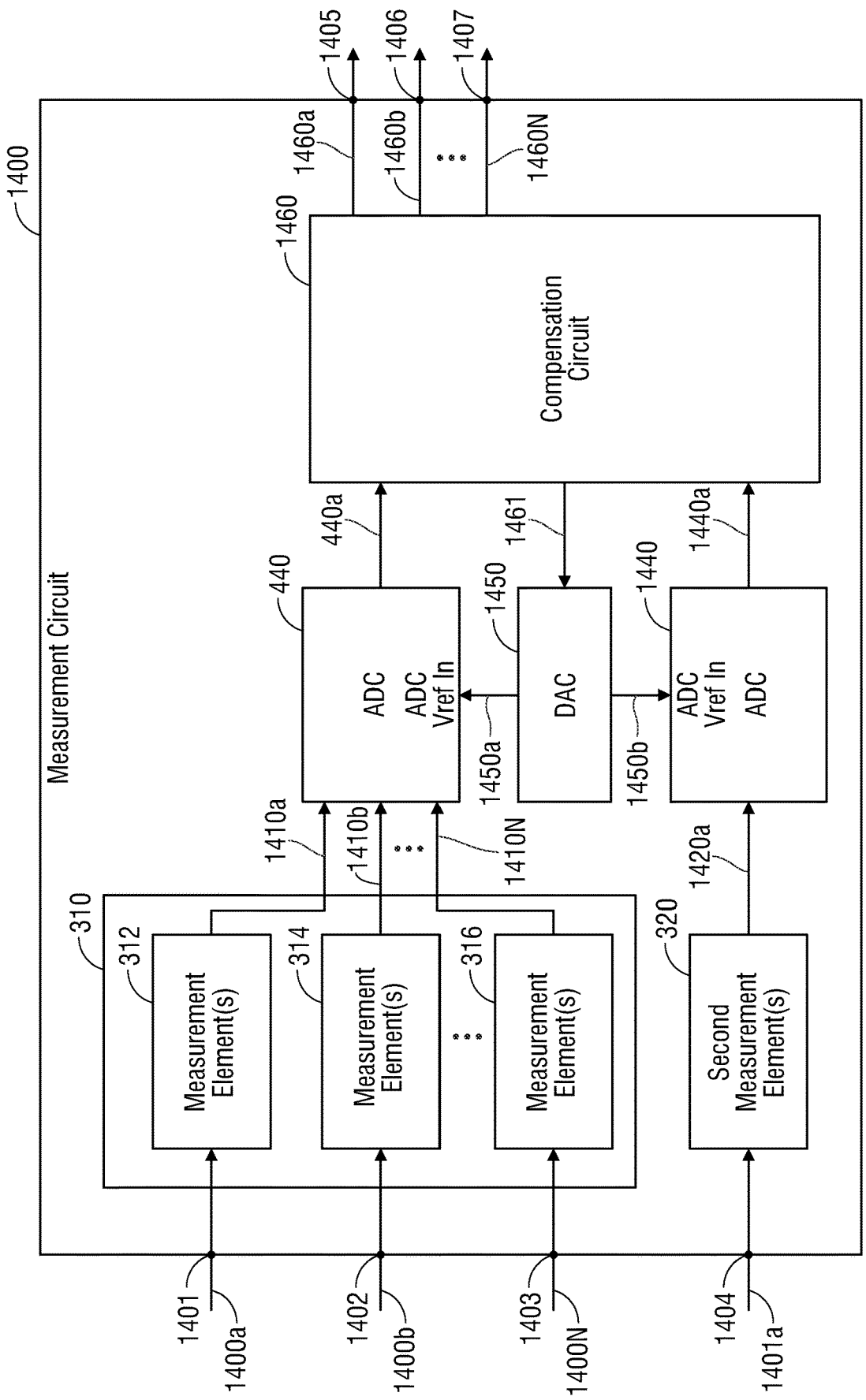
FIG. 4A is a block diagram of another example measurement circuit in accordance with embodiments of the disclosure.

Referring to FIG. 4A, in which like elements of FIGS. 3 and 4 are provided having like reference designations, another example measurement circuit 1400 according to embodiments of the disclosure includes at least one first measurement element 310, at least one second (or reference) measurement element 320, and ADC 440 (here, a first ADC 440). The measurement circuit 1400 also includes a second ADC 1440, a digital to analog converter (DAC) 1450, and a compensation circuit 1460. The at least one first measurement element 310 includes first measurement elements 312, 314, 316 in the illustrated embodiment.

The first ADC 440 has inputs coupled to respective terminals (e.g., second terminals) of the first measurement elements 312, 314, 316 and an output coupled to a respective input of the compensation circuit 1460. Additionally, the first ADC 440 has a reference voltage input (here, labeled ADC Vref In).

The second ADC 1440, which may be the same as or similar to the first ADC 440 in some embodiments, has an input coupled to a respective terminal (e.g., a second terminal) of the at least one second measurement element 320 and an output coupled to a respective input of the compensation circuit 1460. The second ADC 1440 also has a reference voltage input (here, labeled ADC Vref In).

The DAC 1450 has an input coupled to a respective terminal (e.g., an output or control terminal) of the compensation circuit 1460, and outputs coupled to respective reference voltage inputs of the ADCs 440, 1440.

During operation of measurement circuit 1400, the first measurement elements 312, 314, 316 are coupled to input signals 1400a, 1400b, 1400N (e.g., voltage and/or current signals) received at respective inputs 1401, 1402, 1403 of the measurement circuit 1400 and configured to provide respective initial measurement signals 1410a, 1410b, 1410N indicative of a one or more of parameters (e.g., voltage, current, etc.) of the input signals 1400a, 1400b, 1400N. The first ADC 440 is responsive to the initial measurement signals 1410a, 1410b, 1410N and to a reference voltage 1450a to provide converted digital signals (here, shown as single digital signal 440a for simplicity). The reference voltage 1450a is received from DAC 1450, as will be described further below.

The second measurement element 320 is coupled to an input signal 1401a received at input 1404 of the measurement circuit 1400 and configured to provide an output signal 1420a in response thereto. In some embodiments, the input signal 1401a is a known reference signal (e.g., a voltage signal). The second ADC 1440 is responsive to the output signal 1420a and to a reference voltage 1450b to provide a converted digital signal 1440a. The reference voltage 1450b is received from DAC 1450, as will be described further below.

The compensation circuit 1460, which may be the same as or similar to one or more of the other compensation circuits described herein (e.g., 350, shown in FIG. 3), is responsive to the digital signal 1440a and to a reference signal or value to generate a compensation factor indicative of a difference between the digital signal 1440a (i.e., an output of the at least one second measurement element 320) and the reference signal or value. The compensation circuit 1460 is also configured to provide corrected measurement signals 1460a, 1460b, 1460N to respective measurement circuit outputs 1405, 1406, 1407.

In the example embodiment shown, the compensation circuit 1460 is further configured to generate and provide a control signal 1461 to the DAC 1450 to control (or adjust) a voltage level of the reference voltages 1450a, 1450b received at the reference voltage inputs of the ADCs 440, 1440. As discussed above in connection with FIG. 4, ADC 440 has an associated gain and a gain level of the ADC 440 (and signals produced therefrom) is related to the voltage level of the reference voltage received at the reference voltage input of the ADC 440. ADC 1440 similarly has an associated gain and a gain level of the ADC 1440 (and signals produced therefrom) is related to the voltage level of the reference voltage received at the reference voltage input of the ADC 1440.

In embodiments, the control signal 1461 generated by compensation circuit 1460 is related to (or based on) the compensation factor, and the DAC 1450 is implemented to adjust the reference voltages 1450a, 1450b received by the ADCs 440, 1440 (e.g., in a closed loop system) to zero errors (or differences) between digital signal 1440a and nominal results. By adjusting the ADC reference voltages 1450a, 1450b (e.g., in response to the control signal 1461), associated gains (and gain levels) of the ADCs 440, 1440 may be adjusted (in a similar manner to that described above in connection with FIG. 4). Additionally, by adjusting the ADC reference voltages 1450a, 1450b, the ADCs 440, 1440 may cause correction to occur to signals 1410a, 1410b, 1410N, 1420a received by the ADCs 440, 1440 (in a similar manner to correction occurring to signals 410a, 410b, 410N received by ADC 440 shown in FIG. 4). In some embodiments, ADC 1440 is optional and correction is only applied to signals 1410a, 1410b, 1410N received by ADC 440.

Similar to measurement circuits described in connection with figures above, measurement circuit 1400 is capable of dynamically correcting (i.e., in real or substantially real time) outputs of the first measurements elements 312, 314, 316 without impeding normal operation of the measurement circuit 1400.

Figure 5:
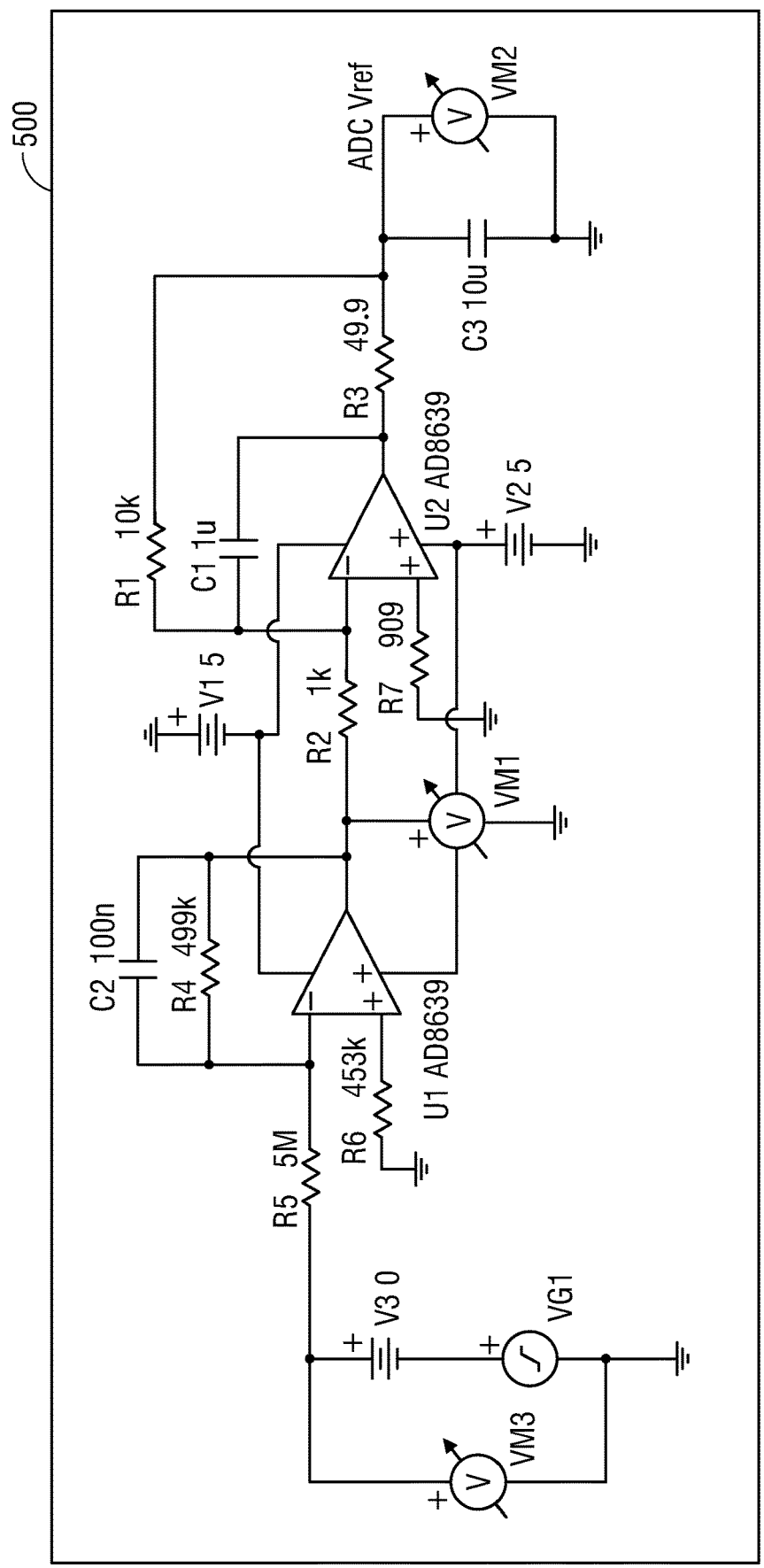
FIG. 5 is a schematic diagram of an example circuit portion of the measurement circuit of FIG. 4, for example.

Referring to FIG. 5, an example circuit portion 500 of measurement circuit 400 of FIG. 4, for example, is shown. More particularly, in some embodiments circuit portion 500 (hereinafter, referred to as "circuit 500") illustrates an example configuration of the witness circuit 420 of measurement circuit 400. The circuit 500 includes at least one second measurement element R5, which may be the same as or similar to second measurement element 320 of witness circuit 420. Additionally, the circuit 500 includes a compensation circuit, which may be the same as or similar to compensation circuit 430 of witness circuit 420.

The second measurement element R5 has a characteristic (here, a resistance) indicative of a stress condition associated with (or aging of) a first measurement element (e.g., 410, shown in FIG. 4) of the measurement circuit. Additionally, the compensation circuit is responsive to an output of the second measurement element R5 and to a reference signal (e.g., as provided by voltage source VM1) for generating a compensation signal for adjusting (i.e., controlling) a voltage level of a reference voltage (here, labeled as ADC Vref) received at an input of an ADC (e.g., 440, shown in FIG. 4) to which the compensation circuit may be coupled. The output of the second measurement element R5 is related to a resistance of the second measurement element R5. A stress condition associated with the first measurement element, for example, may result in a drift in a value (e.g., a resistance) of the first measurement element and the second measurement element R5. Additionally, the stress condition may result in a drift in an output of (or associated with) the first measurement element and the second measurement element R5. In some embodiments, one or more temperature sensors are positioned proximate to (or are include in) measurement circuit 400. Outputs of the temperature sensors may be monitored to approximate an expected drift in a value (e.g., a resistance) of the second measurement element R5, and in turn the first measurement element. As the measurement elements age due to environmental stresses, for example, this will become apparent when a measurement value of second measurement element R5, for example, at a particular temperature (e.g., temperature X) is higher or lower than expected.

In the example embodiment shown, changes in the resistance of second measurement element R5 and the voltage level of the reference voltage ADC Vref will be opposite to each other. For example, if the resistance of the second measurement element R5 increases, the voltage level of the reference voltage ADC Vref may decrease (e.g., to compensate for the increase in resistance, and increase in overall gain of the circuit). Additionally, if the resistance of the second measurement element R5 decreases, the voltage level of the reference voltage ADC Vref may increase (e.g., to compensate for the decrease in resistance, and decrease in overall gain of the circuit). In some embodiments, the increases/decreases in the reference voltage ADC Vref are substantially proportional to the decreases/increases in the resistance of second measurement element R5.

In embodiments, changes in the voltage level of the reference voltage ADC Vref and the gain of the ADC will also be opposite to each other. For example, if the voltage level of the reference voltage ADC Vref increases, the gain of the ADC may decrease. Additionally, in the voltage level of the reference voltage ADC Vref decreases, the gain of the ADC may increase.

Figure 5A:
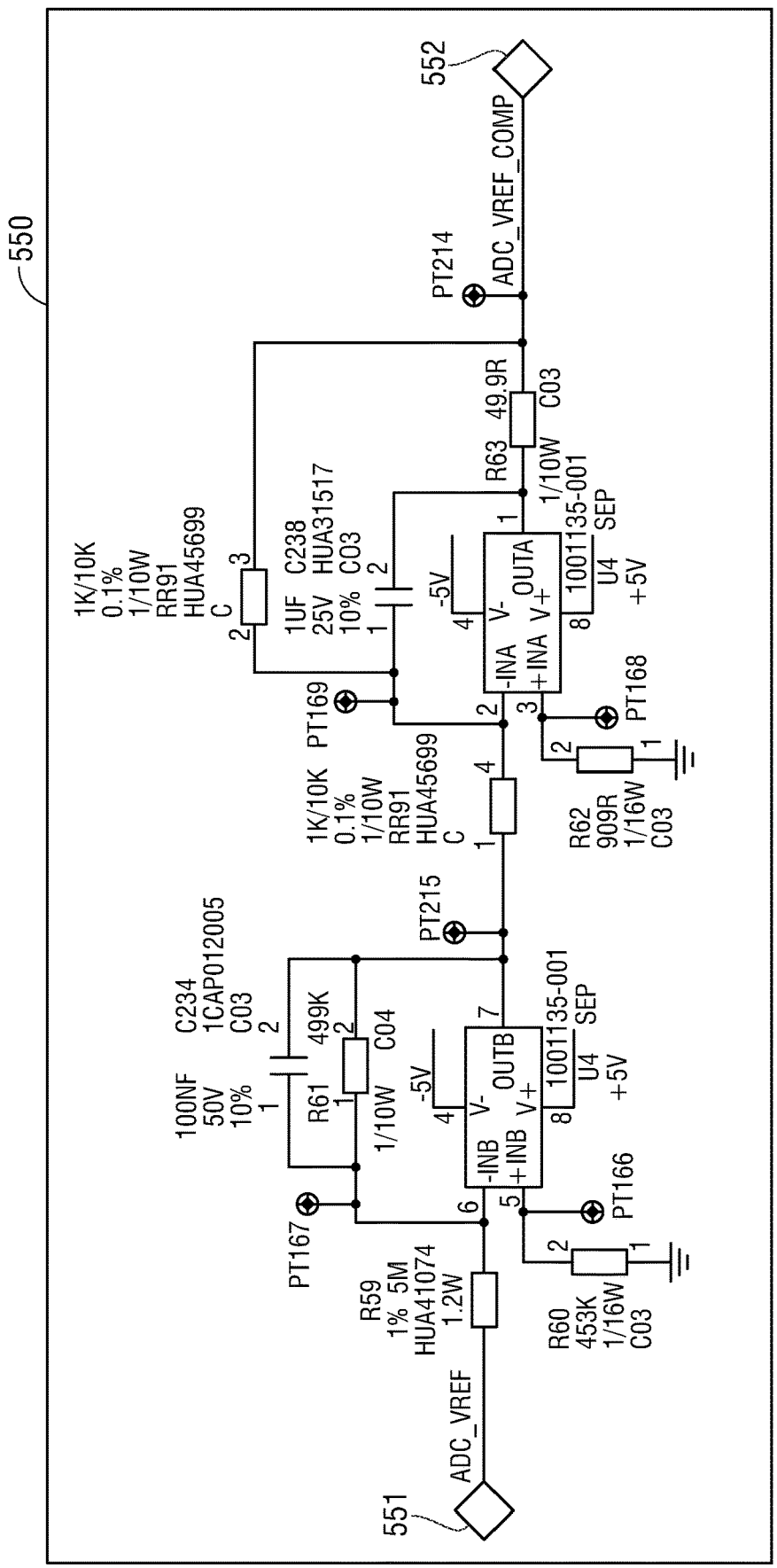
FIG. 5A is a schematic diagram of another example circuit portion of a measurement circuit.

Referring to FIG. 5A, another example circuit portion 550 of a measurement circuit (e.g., 400, shown in FIG. 4) is shown. In some embodiments, circuit portion 550 (hereinafter, referred to as "circuit 530") illustrates an example configuration of a witness circuit (e.g., 420, shown in FIG. 4). The circuit 550 has an input 551 and an output 552. In embodiments, the output 552 is coupled to a reference voltage input of an ADC (e.g., ADC 440, shown in FIG. 4).

The circuit 550 includes a resistor R59 and a resistor R61. In embodiments, the resistor R59 corresponds to a first measurement element of the measurement circuit. Additionally, in embodiments the resistor R61 corresponds to a second measurement element of the measurement circuit. In accordance with embodiments of the disclosure, resistor R61 is of a same resistor technology family as resistor R59 and is expected to show similar drift behavior as resistor R59.

Referring also to prior art measurement circuit 150 shown in FIG. 1A, resistor R59 of circuit 550 shown in FIG. 5A may be a higher drift input resistor similar to resistor R120 of measurement circuit 150. Additionally, resistor R60 of circuit 550 may be of a same resistor technology family as resistor R110 of measurement circuit 150. In the illustrated embodiment of FIG. 5A, the first op-amp stage (from left to right) has a gain (G) of G=−R61/R59, nominally of 0.10. An increase in a resistance value of R59 results in a corresponding reduction in gain. In the illustrated embodiment, the second op-amp stage is configured to provide a gain of −10. It follows that when there is no change in value of R59, for example, ADC_VREF_COMP=ADC_VREF. However, when R59 changes in value due to environmental factors, for example, then ADC_VREF_COMP=ADC_VREF/(% change in value of R59). Tying the foregoing together, if R120 increases in value by ten percent, the measurement circuit will read ten percent lower voltage than that which is actually present. That same change will affect R59, which will result in a decrease of Vref of ten percent. As shown previously, reducing Vref by ten percent will cause the ADC to increase its measurement value by ten percent. In this way the compensation circuit will adjust the gain of the ADC to track the gain of the measurement circuit.

Figure 6:
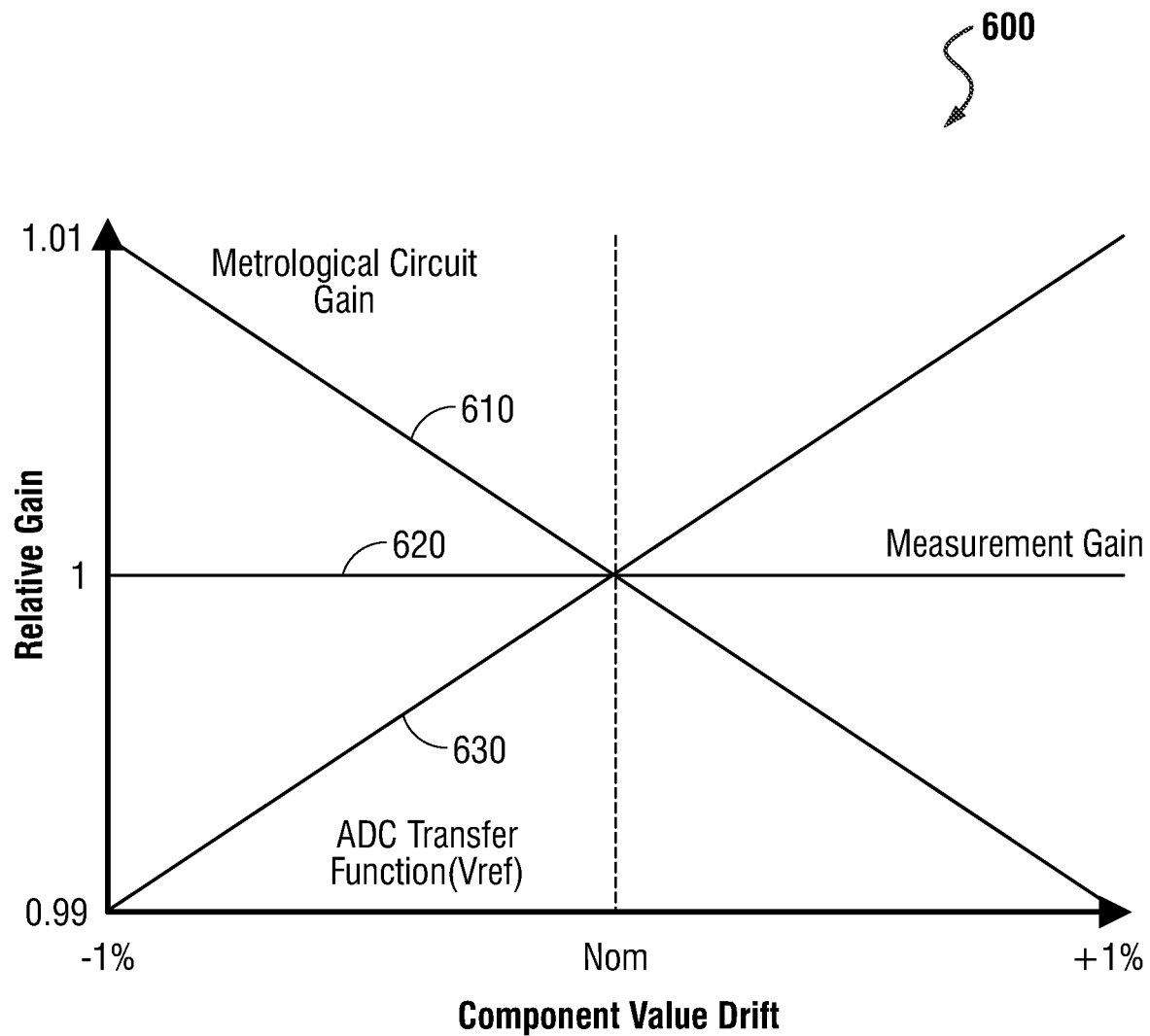
FIG. 6 shows characteristic curves associated with outputs of various portions of the measurement circuit of FIG. 4, for example.

Referring to FIG. 6, a plot 600 has a curve 610 representative of a response characteristic of a second measurement element (e.g., 320, shown in FIG. 4), a curve 630 representative of an ADC reference voltage (e.g., ADC Vref, shown in FIG. 4) generated in response to an output of the second measurement element, and a curve 620 representative of a response characteristic of an ADC (e.g., 440, shown in FIG. 4) coupled to receive the ADC reference voltage. As discussed in figures above, the second measurement element has a characteristic (e.g., a resistance) indicative of a stress condition associated with (or aging of) a first measurement element of a measurement circuit in which both the first measurement element and the second measurement element are provided.

As illustrated, the ADC reference voltage depicted by curve 630 changes in response to changes in a value or output (e.g., a resistance) of the second measurement element depicted by curve 610. The changes in the ADC reference voltage are substantially opposite and proportional to changes in the value of the second measurement element in the example embodiment shown.

As also illustrated, the net gain produced by the ADC coupled to receive the reference voltage is substantially constant, as shown by curve 620. It follows that changes in values of a first measurement element, which result in changes in gain of the first measurement element, may be compensated for by monitoring a characteristic (e.g., a resistance) of a second measurement element (which experiences similar changes as the first measurement element), and adjusting a voltage level of the ADC reference voltage using a compensation circuit (e.g., 430, shown in FIG. 4). In embodiments, a change in the ADC reference voltage may cause a change in the ADC gain in the opposite direction as the gain experienced by the measurements elements (e.g., 410) caused by a change in nominal value. This may create a slope compensation on the overall gain produced by the ADC (e.g., 440, shown in FIG. 4), for example.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in particular applications (e.g., metering applications) but rather, may be useful in substantially any application where it is desired to monitor one or more parameters of an input signal.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A measurement circuit for monitoring at least one parameter of an input signal received from an external signal source, the measurement circuit comprising:
   at least one first measurement element coupled to the input signal and configured to provide an initial measurement signal indicative of a respective one or more of the at least one parameter of the input signal;
   at least one second measurement element positioned proximate to the at least one first measurement element and configured to have a characteristic indicative of a stress condition associated with the at least one first measurement element; and
   a compensation circuit responsive to an output of the at least one second measurement element and to a reference signal to generate a compensation factor indicative of a difference between the output of the at least one second measurement element and the reference signal, the difference indicating a change from a calibrated level for the stress condition associated with the at least one first measurement element, and configured to apply the compensation factor to the initial measurement signal to provide a corrected measurement signal.

2. The measurement circuit of claim 1, wherein the at least one first measurement element comprises a plurality of measurement elements.

3. The measurement circuit of claim 1, wherein the at least one second measurement element comprises a plurality of measurement elements.

4. The measurement circuit of claim 1, wherein the at least one first measurement element comprises a resistor.

5. The measurement circuit of claim 1, wherein the at least one second measurement element comprises a resistor.

6. The measurement circuit of claim 1, wherein the at least one second measurement element comprises a plurality of parallel-coupled measurement elements.

7. The measurement circuit of claim 1, wherein the at least one parameter includes at least one of voltage, current, power, frequency, power factor, demand and energy.

8. The measurement circuit of claim 1, wherein the at least one second measurement element is substantially the same as the at least one first measurement element.

9. The measurement circuit of claim 1, wherein the stress condition is at least one of a temperature condition or an exposure to humidity and/or chemical interactions greater than a predetermined level.

10. The measurement circuit of claim 1, wherein the at least one first measurement element is supported by a same material substrate as the at least one second measurement element.

11. The measurement circuit of claim 1, wherein the at least one first measurement element is supported by a different material substrate than the at least one second measurement element.

12. The measurement circuit of claim 1, wherein the measurement circuit is a measurement circuit for use in a metering device.

13. The measurement circuit of claim 12, wherein the metering device is a metering device for use in a power system.

14. A method for monitoring at least one parameter of an input signal received from an external signal source, comprising:
   providing at least one first measurement element coupled to the input signal and configured to provide an initial measurement signal indicative of a respective one or more of the at least one parameter of the input signal;
   providing at least one second measurement element positioned proximate to the at least one first measurement element and configured to have a characteristic indicative of a stress condition associated with the at least one first measurement element;
   comparing an output of the at least one second measurement element to a reference signal using a compensation circuit to generate a compensation factor indicative of a difference between the output of the at least one second measurement element and the reference signal, the difference indicating a change from a calibrated level for the stress condition associated with the at least one first measurement element; and
   applying the compensation factor to the initial measurement signal to provide a corrected measurement signal.

15. The method of claim 14, wherein the at least one second measurement element comprises a resistor.

16. The method of claim 14, wherein the at least one parameter includes at least one of voltage, current, power, frequency, power factor, demand and energy.

17. The method of claim 14, further comprising: providing the corrected measurement signal to control circuitry for configuring the at least one parameter.

18. The method of claim 14, further comprising: monitoring the output of the at least one second measurement element over a predetermined time period to determine a stress condition type of the stress condition.

19. The method of claim 18, further comprising: providing an indication of the stress condition type through a display device or an output signal of the measurement circuit.

20. The method of claim 19, wherein the stress condition type is at least one of a temperature condition or an exposure to humidity and/or chemical interactions greater than a predetermined level.

\* \* \* \* \*